United States Patent
Yatsu et al.

(10) Patent No.: US 6,298,412 B1
(45) Date of Patent: Oct. 2, 2001

(54) MICROCOMPUTER AND METHOD OF DETERMINING COMPLETION OF WRITING IN THE MICROCOMPUTER

(75) Inventors: Tsunehiko Yatsu, Tatebayashi; Kazumasa Chigira, Kiryu; Kazuo Hotaka, Hanyu; Norimasa Kanahori, Ashikaga, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/218,944

(22) Filed: Dec. 22, 1998

(30) Foreign Application Priority Data

Dec. 25, 1997 (JP) .................................................... 9-357470

(51) Int. Cl.[7] .................................................. G06F 12/02
(52) U.S. Cl. .......................... 711/101; 711/156; 711/166; 710/18; 710/19; 710/66; 714/30
(58) Field of Search .................................. 711/103, 166, 711/156, 101, 104, 105; 714/30; 365/189.07; 710/18, 19, 66

(56) References Cited

U.S. PATENT DOCUMENTS 5,557,572 * 9/1996 Sawada et al. .................. 365/189.07
5,559,956 * 9/1996 Sukegawa ........................ 395/182.06

* cited by examiner

*Primary Examiner*—Hiep T. Nguyen
(74) *Attorney, Agent, or Firm*—Hogan & Hartson L.L.P.

(57) ABSTRACT

When writing of data into nonvolatile memories 8H and 8L is started, data D7 and D15 corresponding to the 128th word of a data input section 8B are inverted and outputted. When accurate writing is subsequently performed, the data D7 and D15 are outputted as they are. By monitoring a change of the data D7 and D15 from the nonvolatile memories 8H and 8L, it is possible to detect whether writing is still continuing or has already completed. Thus, by using nonvolatile memories of 8 bit data width or the like, a 16-bit microcomputer can be easily realized.

14 Claims, 3 Drawing Sheets

MICROCOMPUTER AND METHOD OF DETERMINING COMPLETION OF WRITING IN THE MICROCOMPUTER

BACKGROUND OF THE INVENTION

1. Field of the Invention

The present invention relates to a microcomputer using, for example, memories of N (8) bit data width as a single memory of N×M (16) bit data width and a method of determining completion of writing in the microcomputer.

2. Description of the Related Art

Generally, a microcomputer has a built-in mask ROM in which a program for operation control is stored, or a built-in RAM in which data are stored. Further, a nonvolatile memory (flash memory) which can electrically erase written data in a block is well known. Lately, there has been a tendency for a microcomputer to have a built-in nonvolatile memory as a substitute for the mask ROM or the RAM described above. If a nonvolatile memory is built into a microcomputer, due to the capability of nonvolatile memory to enable electrical erasing of written data, it will bring about an advantage that a program for operation control can be rewritten. Thus, cases in which a microcomputer has a built-in nonvolatile memory are increasing.

Microcomputers having a built-in memory of 8 bit data width were mainly used up until recently, but 16-bit type microcomputers have been developed most recently. Among the 16-bit type microcomputers, there is a microcomputer which uses two nonvolatile memories of 8 bit data width arranged in parallel as a single nonvolatile memory of 16 bit data width. In such a microcomputer, there is a case where data are rewritten into the nonvolatile memories on the microcomputer (self-writing).

However, usually in the microcomputer described above, unless the constitution of a microcomputer control section (microcomputer core) is changed to be applicable not to 8 bits, but to 16 bits, the 16 bit type microcomputer cannot be operated. The change of a microcomputer from 8-bit type to 16-bit type requires drastic improvement of the constitution of the microcomputer control section. Especially, program data for self-writing have to be changed drastically so as to be applicable to the 16-bits type microcomputer. Further, such improvement causes an increase of chip area or a fluctuation of circuit characteristics at the time of integration. Thus, a change of circuit is not that easy.

SUMMARY OF THE INVENTION

The purpose of the present invention is to easily realize a microcomputer for M×N bits without causing an increase of chip area or a fluctuation of circuit characteristics even though a microcomputer control section for N bits is used without being modified, in other words, even though a data rewrite program for N bits is used as it is.

The present invention is characterized in that in a microcomputer using M nonvolatile memory devices of N bit data width, which can electrically erase data in a block, as a single memory of N×M bit data width, in a writing mode, data is writing into the M nonvolatile memory devices, and completion of writing is confirmed from the condition of a memory output which is produced using data at the predetermined nth bit from among data to be written into each of the M nonvolatile memory devices.

The present invention is further characterized in that at the time of writing, the memory output is produced by inverting the data at the predetermined nth bit, and when the memory output is inverted to data to be written which have been held beforehand, it will be determined that writing is in progress, and when the memory output becomes non-inverted and non-inverted data coincide with data to be written which have been held beforehand, it will be determined that writing has been completed.

The present invention is further characterized in that in particular, the memory output mentioned above is data at the predetermined nth bit in the final address of an area of each of the nonvolatile memory devices where data are written.

The present invention is further characterized in that in a method of determining completion of writing data into a built-in memory of a microcomputer, the microcomputer uses M, equivalent to two or more, nonvolatile memory devices of N bit data width, which can electrically erase data in a block, as a single memory of N×M bit data width, and in a writing mode, when data to be written are supplied to the M nonvolatile memory devices, a predetermined memory output is produced by extracting at each of the M nonvolatile memory devices data at the predetermined nth bit from among the data to be written; when data, which are read out from the M nonvolatile memory devices after the data to be written were actually written into the M nonvolatile memory devices, coincide with the data to be written which have been held, a condition of the memory output is changed, and the condition of the memory output is monitored, whereby completion of writing the data into the memory is determined.

The present invention is further characterized in that in the method of determining completion of writing data into a built-in memory of a microcomputer, the memory output is inverted data of the extracted data at the predetermined nth bit of each of the M nonvolatile memory devices when the data to be written are supplied to the M nonvolatile memory devices, and non-inverted data of the extracted data at the predetermined nth bit when data, which are read out from the M nonvolatile memory devices after the data to be written are actually written into the M nonvolatile memory devices, coincide with the data to be written which have been held. When the memory output is the inverted data, it will be determined that writing of data into the M nonvolatile memory devices is in progress and when the memory output is the non-inverted data, it will be determined that writing of data into the M nonvolatile memory devices has been completed.

The present invention is further characterized in that in a microcomputer, the microcomputer is a microcomputer using M, equivalent to two or more, nonvolatile memory devices of N bit data width, which can electrically erase data in a block, as a single memory of N×M bit data width, and in a writing mode, when data to be written are supplied to the M nonvolatile memory devices, a predetermined memory output is produced by extracting, at each of the M nonvolatile memory devices, data at the predetermined nth bit from among the data to be written. When data, which are read out from the M nonvolatile memory devices after the data to be written were actually written into the M nonvolatile memory devices, coincide with the data to be written which have been held, a condition of the memory output is changed and the condition of the memory output is monitored, whereby completion of writing the data into the memory is determined.

The present invention is further characterized in that in the microcomputer, the memory output is inverted data of the extracted data at the predetermined nth bit of each of the M nonvolatile memory devices when the data to be written are supplied to the M nonvolatile memory devices, and non-inverted data of the extracted data at the predetermined nth bit when data, which are read out from the M nonvolatile memory devices after the data to be written are actually written into the M nonvolatile memory devices, coincide with the data to be written which have been held. When the memory output is the inverted data, it will be determined that writing of data into the M nonvolatile memory devices is in progress and when the memory output is the non-inverted data, it will be determined that writing of data into the M nonvolatile memory devices has been completed.

The present invention is further characterized in that in a microcomputer, the microcomputer is a microcomputer using M, equivalent to two or more, nonvolatile memory devices of N bit data width, which can electrically erase data in a block, as a single memory of N×M bit data width, and the microcomputer is composed of a data input section to be connected with the nonvolatile memories being capable of outputting data at the predetermined nth bit, a circuit for making output data of the data input section inverted or non-inverted, a data output section to be connected with the nonvolatile memories for reading out and outputting data written into the nonvolatile memories, a coincidence detecting circuit for detecting whether or not data in the data input section and data in the data output section coincide with each other, and a control circuit for controlling an inversion and non-inversion of the circuit when writing data from the data input section into the nonvolatile memory devices is started or the writing is completed.

The present invention is further characterized in that in the microcomputer, the circuit makes output data of the data input section inverted at the beginning of writing and makes the output data non-inverted at the completion of writing.

The present invention is further characterized in that the microcomputer determines that writing of data is in progress when output data of the circuit is inverted data and that writing is completed when output data of the circuit is non-inverted data.

The present invention is further characterized in that in the microcomputer, the circuit is composed of an inversion element for making the output data of the data input section inverted and a selection circuit for selecting either one of the output data of the data input section and an output of the inversion element.

The present invention is further characterized in that in the microcomputer, as data which are outputted from the circuit, data which are to be written in the last address of each of the M nonvolatile memory devices are used from among the data to be written into the nonvolatile memories.

The present invention is further characterized in that in the microcomputer, the coincidence detecting circuit detects a coincidence of data at the predetermined nth bit in the data input section and data at the predetermined nth bit in the data output section.

According to the present invention, by monitoring a presence of variation of the memory output at the predetermined nth bit of each nonvolatile memory device, it can be determined that writing has been completed when there is any variation.

According to the present invention, since a state of writing data is confirmed by monitoring a variation of the memory output from each nonvolatile memory, by using a microcomputer control section not for N×M bits, but for example N (8, etc.) bits as it is in order to control M nonvolatile memory devices which are used as a memory of N×M bit data width, a microcomputer for N×M (16) bits can be realized easily without causing an increase of chip area or a fluctuation of circuit characteristics.

DESCRIPTION OF THE PREFERRED EMBODIMENT

Figure 1:
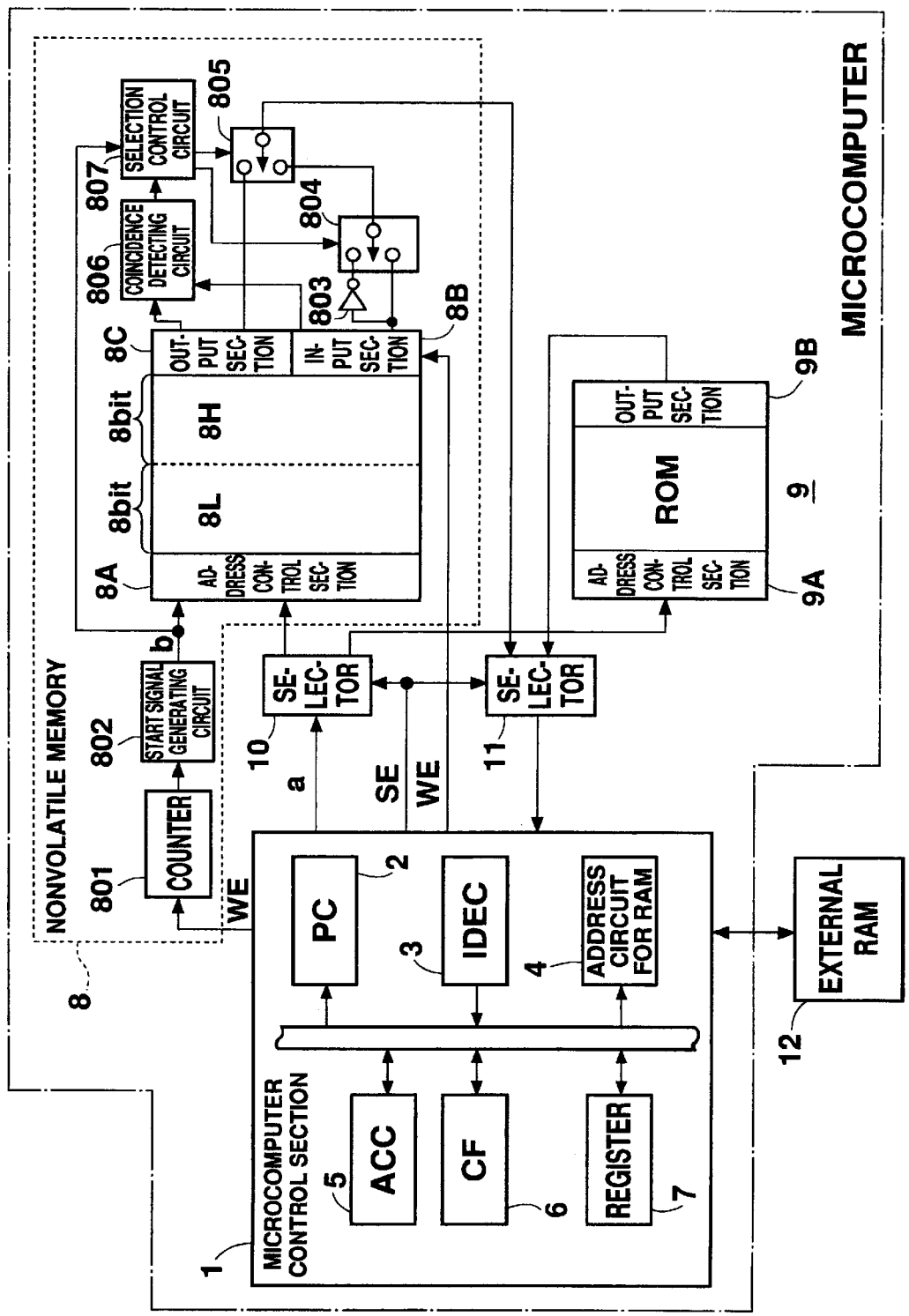
FIG. 1 is a block diagram showing a microcomputer according to an embodiment of the present invention.

FIG. 1 shows a microcomputer according to an embodiment of the present invention. Numeral 1 is a microcomputer control section. the microcomputer control section has a program counter (PC) 2 for generating an address signal according to a counted value, an instruction decoder (IDEC) 3 for decoding program data into various instructions, an address circuit 4 for RAMs which generates an address signal to an external RAM 12, an accumulator (ACC) 5 in which a state of writing data is written as a flag, a flag (CF) 6, and a register 7 in which data are temporarily stored. Numeral 8 is a nonvolatile memory which is used both as a ROM area where a program is written and a RAM area where data are written. The nonvolatile memory 8 has an address control section 8A, a data input section 8B, and a data output section 8C. Also in these nonvolatile memory 8, a counter 801 for counting the number of write signals generated, a start signal generating circuit 802 for starting internal writing, a first selection circuit 804 for selecting either output data stored in the data input section 8B or data which have become the inversion of the data through an inverter 803, a second selection circuit 805 for selecting either output data of the first selection circuit 804 or output data of the data output section 8C, a coincidence detecting circuit 806 for detecting whether or not data to be written coincide with data already written, and a selection control circuit 807 for controlling the first and second selection circuits 804 and 805 are built in, respectively. Further, two of nonvolatile memory (devices) sections of 8 bit data width 8H and 8L are virtually used as a memory of 16 bit data width. Numeral 9 is a ROM which has an address control section 9A and a data output section 9B and into which a program for rewriting data stored in RAM areas of the nonvolatile memories 8L and 8H is written.

Numeral 10 is a first selector for forwarding an address signal, which is transmitted from the microcomputer control section 1, to either the nonvolatile memory 8 or the ROM 9. Numeral 11 is a second selector for forwarding to the microcomputer control section 1 either output data of the nonvolatile memory 8 or output data of the ROM 9.

Rewriting of data in the RAM area of the nonvolatile memory 8 to be performed according to an instruction as to external interruption in the constitution shown in FIG. 1 will be described with reference to the flowchart of FIG. 2.

First, before description is given of the rewriting of data, operation of the microcomputer according to a program which is written into an area used as a ROM area of the nonvolatile memory 8 will be described. In the case of normal operation, the microcomputer is operated according to the program written into the ROM area of the nonvolatile memory 8. The count value of the PC 2 in the microcomputer control section 1 is incremented, and an address signal a is generated according to a counted value of the PC2. The address signal a is inputted to the address control section 8A of the nonvolatile memory 8 via the first selector 10. The first selector 10 is switched by a select signal SE from the microcomputer control section 1. When the microcomputer is operated according to the program in the nonvolatile memory 8, the first selector 10 is switched to the side of the nonvolatile memory 8 by the select signal SE.

A part of addresses of the nonvolatile memory 8 and addresses of the ROM 9 are attached in the same manner, and addresses 0000H through 00FFH are attached to the ROM areas. It is preferable to automatically switch an output line of the address signal a by the first selector 10 after detecting when a designated address belongs to the nonvolatile memory 8 or the ROM 9. Further, it is preferable to let an upper bit of the address detected be inputted into the second selector 11 and let either output data of the nonvolatile memory 8 or output data of the ROM 9 be selected according to the address signal a.

In the nonvolatile memory 8, the address signal a is decoded by the address control section 8A and addresses of the nonvolatile memory sections 8L and 8H are designated. The nonvolatile memory sections of 8 bit data width 8L and 8H serve as a single memory of 16 bit data width, and program data of 16 bits designated by address are read out and then outputted from the data output section 8C. At the time of normal reading, the selection control circuit 807 controls the second selection circuit 805 to select output data of the data output section 8C. Thus, output program data from the data output section 8C are inputted into the second selector 11.

Program data are inputted into the microcomputer control section 1 via the second selector 11, which selects output data of the nonvolatile memory 8 using the select signal SE. The program data are decoded into program instructions by the IDEC 3, so that various operations are carried out. The count value of the PC 2 is then incremented, the next address of the nonvolatile memory 8 is designated, and various instructions are executed according to the program data. Normal operation of the microcomputer is simply repetition of the operation described above.

Figure 2:
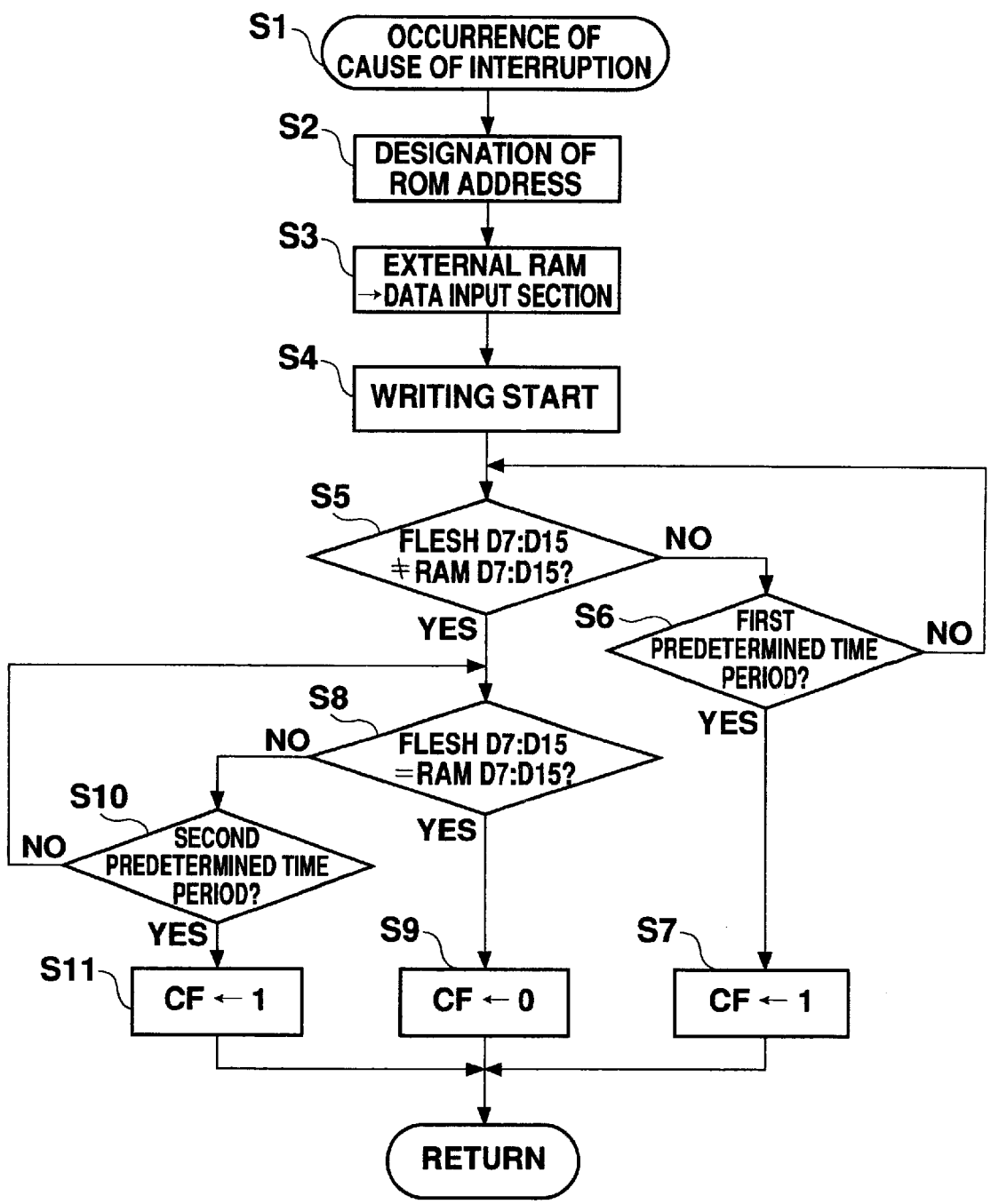
FIG. 2 is a flow chart showing operation in the constitution of FIG. 1.

When an interruption arises from outside during normal operation of the microcomputer and a request for rewriting data in an area to serve as a RAM of the nonvolatile memory 8 is received (Step 1) as shown in FIG. 2, the microcomputer is switched to a write mode. The PC 2 is then set to a predetermined count value and a predetermined address signal is generated, thereby designating an address of the ROM 9 into which a program for rewriting data in the nonvolatile memory sections 8H and 8L is written. When the address of the ROM 9 is designated, a state of the select signal SE is simultaneously changed. Thus, the first selector 10 forwards the address signal a to the ROM 9 and the second selector 11 is switched so as to select the output data of the ROM 9 (step 2).

Afterwards, the count value of the PC 2 is incremented, an address of the ROM 9 is designated, and program data are read out from the ROM 9 and inputted into the microcomputer control section 1 via the second selector 11. According to an instruction obtained by decoding the program data in the IDEC 3, the program for rewriting data is executed. According to the data rewrite program, an address of an external RAM 12 is first designated and data to be written are read out. The data equivalent to 128 words, which are read out, are kept in the register 7 of the microcomputer control section 1. When all of the data corresponding to 128 words are kept in the register 7, forwarding of the data to the data input section 8B of the nonvolatile memory 8 is started.

The data input section 8B constitutes a part of the nonvolatile memory 8. Address data are generated from the PC 2 of the microcomputer control section 1 and addresses of the data input section 8B are designated. Afterwards, data which have been kept in the register 7 are outputted, and then the data are written into the data input section 8B by outputting a write signal WE. By repeating such operation 128 times, data corresponding 128 words are written into the data input section 8B (Step 3). On the other hand, the write signal WE is also inputted to the counter 801, and the number of times the write signal is outputted is detected. In other words, the counter 801 detects how many times the data are written into the data input section 8B. When writing of data into the data input section 8B is performed 128 times, the count value of the counter 801 will become 128 and the counter 801 will generate an output representing that the data corresponding to 128 words are written into the data input section 8B. In response to the output, the start signal generating circuit 802 will generate a start signal b.

The start signal b is inputted into the address control section 8A and operation of internal writing of data into the nonvolatile memory sections 8L and 8H is started. The address control section 8A has a built-in circuit for writing data stored in the data input section 8B into the nonvolatile memory sections 8L and 8H in response to the start signal b. More specifically, the address control section 8A sets a write start address of the nonvolatile memory sections 8L and 8H, designates 128 addresses one by one starting from the write start address, reads out data from the data input section 8B every time the designation is performed, and writes the data into the designated addresses of the nonvolatile memory sections 8L and 8H (Step 4). Since the nonvolatile memory sections of 8 bit (N bit) data width 8L and 8H have the same addresses, by designating a single address, it is possible to designate a data area of 16 bits (N×M bits) of the nonvolatile memory sections 8L and 8H.

Further, the start signal b is also inputted to the selection control circuit 807. According to the start signal b, the selection control circuit 807 controls the first selection circuit 804 to select an output signal of the inverter 803 and the second selection circuit 805 to select an output signal of the first selection circuit 804, respectively. The input section 8B has a constitution such that at least data D7 and D15 at the 8th bit and the 16th bit in the 128th address among the written data can be outputted to the outside. Further, it can forward data D7 and D15 through an input line from the microcomputer control section 1. Thus, at an output end of the second selection circuit 804, inverted output data *D7 and *D15 of the data input section 8B are generated.

These inverted output data are inputted as a memory output into the microcomputer control section 1 via the second selector 11. Thus, in the microcomputer control section 1, after rewriting of data in the nonvolatile memory sections 8L and 8H is started, values of the data D7 and D15 in the nonvolatile memory sections 8L and 8H are monitored. Specifically, it is confirmed whether or not the inverted data *D7 and *D15 as a memory output are inverted to the data D7 and D15 at the 128th address which are kept in the register 7. In other words, it is confirmed whether or not an output (*D7 and *D15) is inverted to data which is the 128th word in the RAM 12 (Step 5).

When the data D7 and D15 in the register 7 as the data of the RAM 12 and the *D7 and *D15 as an output are inverted with respect to each other, it will be recognized that writing is in progress and the program will advance to the next step. When these data are not inverted with respect to each other, the state of being not inverted will be monitored for a predetermined time period (Step 6). When this state continues even after the first predetermined time period elapses, it will be determined that writing has not been performed, and the flag CF will be set to 1 (Step 7).

When the data D7 and D15 corresponding to the 128th word in the data input section 8B are supplied to the microcomputer control section 1 as a memory output after it is recognized that writing is in progress, the microcomputer control section 1 confirms at Step 5 whether the data D7 and D15 coincide with data in the register 7. First, when internal writing operation is completed, non-inverted data are outputted from the nonvolatile memory sections 8L and 8H and the written data D7 and D15 corresponding to the 128th word of the nonvolatile memory sections 8L and 8H are inputted into the coincidence detecting circuit 806. It is then detected whether these data D7 and D15 coincide with the data D7 and D15 corresponding to the 128th word of the data input section 8B. When these data coincide with each other, according to an output signal of the coincidence detecting circuit 806, the selection control circuit 807 will control the first selection circuit 804 to select non-inverted output data of the data input section 8B and the second selection circuit 805 to select an output of the first selection circuit 804, respectively. Thus, when accurate writing of data into the nonvolatile memory sections 8L and 8H is carried out, the data D7 and D15 corresponding to the 128th word of the input data section 8B to be outputted to the microcomputer control section 1 as a memory output is switched from a state of being inverted to a state of being non-inverted. The memory output (data D7 and D15) is inputted into the microcomputer control section 1, and it is confirmed whether or not the memory output coincides with the data D7 and D 15 corresponding to the 128th word in the register 7 (step 8). When the coincidence is confirmed, it will be recognized that writing has been completed, and the flag CF will be set to zero (Step 9). The program for rewriting stored in the ROM 9 is then terminated, and the microcomputer returns to the program of the nonvolatile memory sections 8L and 8H which was executed prior to the interruption, thereby returning to normal operation according to the program.

When discordance is confirmed, the state of discordance will be monitored for a second predetermined time period (Step10). When this state continues even after the second predetermined time period elapses, it will be determined that writing has been incomplete due to a writing error or the like, and the flag CF will be set to 1 (Step 11). Afterwards, the microcomputer returns to the program in the nonvolatile memory sections 8H and 8L which was executed prior to the interruption. Similarly, after Step 7, the microcomputer also returns to the program.

As described above, data are outputted from each of two nonvolatile memory sections 8H and 8L, and by monitoring only a change of the output data, it is possible to detect whether or not writing of data has been completed.

After the completion of the program, by monitoring a state of the flag CF, the microcomputer control section 1 determines whether or not rewriting has been successful.

In FIG. 1, it is detected if writing of data is in progress or completed by monitoring a change of the data D7 and D15. However, it is also preferable to carry out similar detection using something other than these data. Further, in FIG. 1, two nonvolatile memory sections of 8 bit data width 8H and 8L are used as a single memory of 16 bit data width. However, it is possible to apply the present invention to another embodiment in which M nonvolatile memory devices of N bit data width are used as a single memory. In this case, it will be sufficient if a change of M items of data to be written in a predetermined address of each memory is detected as described above.

Figure 3:
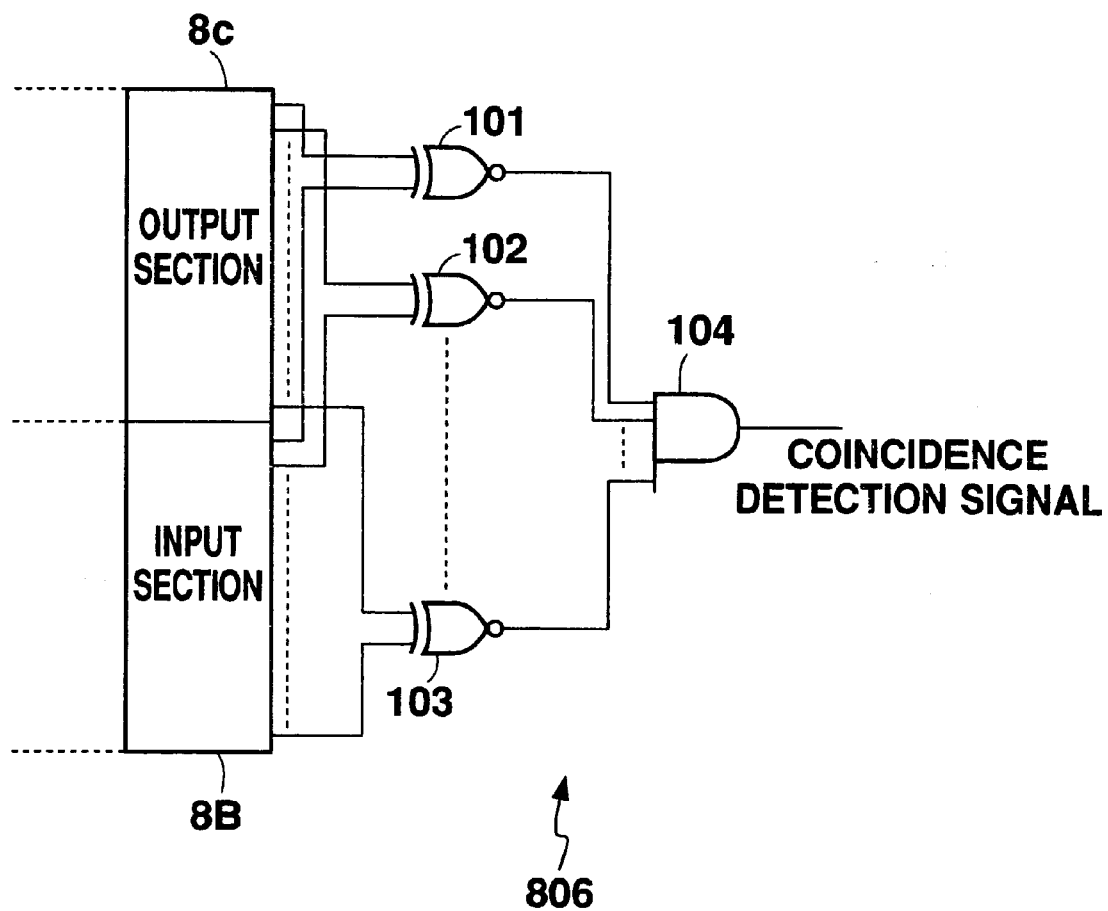
FIG. 3 is a circuit diagram showing a concrete example of the coincidence detecting circuit 806 of FIG. 1.

FIG. 3 shows a concrete example of the coincidence detecting circuit 806. In this drawing, data which are written into the data input section 8B and data from the data output section 8C are inputted into EX-OR gates (exclusive-OR gates) 101 to 103 corresponding to the respective addresses. These EX-OR gates number 128, corresponding to the respective addresses. When both input data coincide with each other at either level 0 or 1, an output representing level 1 is generated. In other words, if the data of the output data section 8C are same as the data of the input data section 8B, an EX-OR gate 101 will generate an output representing level 1. When all of the EX-OR gates 101 finish generating outputs representing level 1, an AND gate 104 outputs a coincidence detection signal representing level 1. In this case, coincidence of data is detected at each address. However, it is also preferable to confirm only the coincidence of the respective data D7 and D15 corresponding to the 128th word of the data input section 8B and the data output section 8C as shown in FIG. 1.

A concrete example of the coincidence detecting circuit 806 is not limited to that shown in FIG. 3. Other circuit having different constitution may be applied to the present invention.

As described above, in this embodiment, while an internal program, such as a program for rewriting data, is executed, the nth data corresponding to a predetermined word are read out from each of the nonvolatile memories, and data inverted to the data read out are outputted. When the program is completed, the data are non-inverted and outputted, and then the output data are monitored. Data polling such that a process of writing data is confirmed on the side of the microcomputer control section is thus performed.

Even though actual data are not read out from a memory area, by outputting through hardware the data stored in the data input section 8B, the nonvolatile memories can have a constitution such that it appears as if the data had been read out from the memory area. Thus, by performing data polling for 8 bits, it is possible to monitor a process of writing data or a completion of writing data. Further, by using the data of the data input section 8B, even though two different memories are used, reliable detection can be realized. Further, by installing a circuit, such as a coincidence detecting circuit, in the nonvolatile memories, hardware which enables the nonvolatile memories to determine a completion of writing by themselves is incorporated. Thus, without modifying the 8-bit microcomputer control section, the program for 8 bits is possible to deal with the program for 16 bits.

What is claimed is:

1. A microcomputer, wherein said microcomputer is a microcomputer using M, equivalent to two or more, nonvolatile memories of N bit data width, which can electrically erase data in a block, as a single memory of N×M bit data width, said microcomputer comprising:

a data input section to be connected with said nonvolatile memories, being capable of outputting data at a predetermined nth bit;

a circuit for making output data of said data input section inverted or non-inverted;

a data output section to be connected with said nonvolatile memories, for reading out and outputting data written into said nonvolatile memories;

a coincidence detecting circuit for detecting whether or not data of said data input section and data of said data output section coincide with each other; and a control circuit for controlling an inversion and non-inversion of said circuit when writing data from said data input section into said nonvolatile memories is started or completed.

2. The microcomputer according to claim 1, wherein said circuit makes output data of said data input section inverted at the beginning of writing and makes the output data non-inverted at the completion of writing.

3. The microcomputer according to claim 2, said microcomputer determines that writing of data is in progress when output data of said circuit is inverted data and that writing is completed when output data of said circuit is non-inverted data.

4. The microcomputer according to claim 5, wherein said circuit comprising:
   an inversion element for making said output data of said data input section inverted; and
   a selection circuit for selecting either one of said output data of said data input section and an output of said inversion element.

5. The microcomputer according to claim 1, wherein as data which are outputted from said circuit, data which are to be written in a last address of each of said M nonvolatile memories are used from among data to be written into said nonvolatile memories.

6. The microcomputer according to claim 1, wherein said coincidence detecting circuit detects a coincidence of data at a predetermined nth bit in said data input section and data at a predetermined nth bit in said data output section.

7. A method of determining completion of writing in a microcomputer,
   wherein in the microcomputer using M nonvolatile memory devices of N bit data width, which can electrically erase data in a block, as a single memory of N×M bit data width,
      in a writing mode, data is writing into said M nonvolatile memory devices, and it is determined, from a condition of a memory output which is produced using data at a predetermined nth bit from among data to be written into each of said nonvolatile memory devices, that writing has been complete; and
      at the time of writing, said memory output is produced by inverting said data at the predetermined nth bit, and when said memory output is inverted with respect to data to be written which have been held beforehand, it will be determined that writing is in progress, and when said memory output becomes non-inverted and non-inverted data coincide with data to be written which have been held beforehand, it will be determined that writing has been completed.

8. The method of determining completion of writing in a microcomputer according to claim 7, wherein said memory output is data at a predetermined nth bit in a final address of an area of each of said nonvolatile memories in which data are written.

9. A method of determining completion of writing data into a built-in memory of a microcomputer, wherein said microcomputer is a microcomputer using M, equivalent to two or more, nonvolatile memory devices of N bit data width, which can electrically erase data in a block, as a single memory of N×M bit data width,
   and in a writing mode:
      when data to be written are supplied to said M nonvolatile memory devices, a predetermined memory output is produced by extracting at each of said M nonvolatile memory devices data at a predetermined nth bit from among said data to be written;
      when data, which are read out from said M nonvolatile memory devices after said data to be written were actually written into said M nonvolatile memory devices, coincide with said data to be written which have been held, a condition of said memory output is changed; and
      by monitoring the condition of said memory output, it is determined whether or not writing into said memory has been completed.

10. The method according to claim 9, wherein said memory output is:
    inverted data of said extracted data at a predetermined nth bit of said M nonvolatile memory devices when said data to be written are supplied to said M nonvolatile memory devices; and
    non-inverted data of said extracted data at a predetermined nth bit when data, which are read out from said M nonvolatile memory devices after said data to be written are actually written into said M nonvolatile memory devices, coincide with said data to be written which have been held, and when said memory output is said inverted data, it will be determined that writing of data into said M nonvolatile memory devices is in progress and when said memory output is said non-inverted data, it will be determined that writing into said M nonvolatile memory devices has been completed.

11. The method according to claim 9, wherein as said memory output, data which are to be written in a last address of each of said M nonvolatile memory devices are used from among data to be written into said M nonvolatile memory devices.

12. A microcomputer, wherein said microcomputer uses M, equivalent to two or more, nonvolatile memory devices of N bit data width, which can electrically erase data in a block, as a single memory of N×M bit data width, and in a writing mode:
    when data to be written are supplied to said M nonvolatile memory devices, a predetermined memory output is produced by extracting, at each of said M nonvolatile memory devices, data at a predetermined nth bit from among said data to be written;
    when data, which are read out from said M nonvolatile memory devices after said data to be written were actually written into said M nonvolatile memory devices, coincide with said data to be written which have been held, a condition of said memory output is changed; and
    by monitoring the condition of said memory output, it is determined whether or not writing into said memory has been completed.

13. The microcomputer according to claim 12, wherein said memory output is:
    inverted data of said extracted data at a predetermined nth bit of each of said M nonvolatile memory devices when said data to be written are supplied to said M nonvolatile memory devices; and
    non-inverted data of said extracted data at a predetermined nth bit when data, which are read out from said M nonvolatile memory devices after said data to be written are actually written into said M nonvolatile memory devices, coincide with said data to be written which have been held, and when said memory output is said inverted data, it will be determined that writing of data into said M nonvolatile memory devices is in progress and when said memory output is said non-inverted data, it will be determined that writing of data into said M nonvolatile memory devices has been completed.

14. The microcomputer according to claim 12, wherein as said memory output, data which are to be written in a last address of each of said M nonvolatile memory devices are used from among data to be written into said M nonvolatile memory devices.

* * * * *